United States Patent [19]

Chang

[11] Patent Number: 5,828,270
[45] Date of Patent: Oct. 27, 1998

[54] METHOD AND APPARATUS FOR MODULATING AND DEMODULATING A CARRIER

[75] Inventor: Chen-Nan Chang, Keelung, Taiwan

[73] Assignee: Chao-Jung Liu, Chung-Ho, Taiwan

[21] Appl. No.: 783,038

[22] Filed: Jan. 14, 1997

[51] Int. Cl.[6] .............................. H03K 7/00; H03K 9/00; H04L 27/00

[52] U.S. Cl. .......................... 332/106; 329/311; 375/259; 375/295; 375/340

[58] Field of Search ..................................... 332/106, 108, 332/185; 329/311, 372; 327/14, 15; 375/239, 259, 295, 316, 340

[56] References Cited

U.S. PATENT DOCUMENTS

4,159,448   6/1979   Parham ................................ 332/108 X

Primary Examiner—David Mis
Attorney, Agent, or Firm—Foley & Lardner

[57] ABSTRACT

In a method and apparatus for generating a composite signal, a modulated signal corresponding to an n-bit digital data byte is inserted between consecutive carrier cycles of a carrier. The modulated signal is in the form of a ramp voltage of fixed duration and has a slope that corresponds to the n-bit digital data byte. The composite signal is demodulated by detecting the start of the modulated signal in the composite signal, determining the slope of the modulated signal, and converting the slope of the modulated signal into the n-bit digital data byte.

16 Claims, 6 Drawing Sheets

METHOD AND APPARATUS FOR MODULATING AND DEMODULATING A CARRIER

BACKGROUND OF THE INVENTION

1. Field of the Invention

The invention relates to a method and apparatus for modulating and demodulating a carrier with n-bit digital data bytes.

2. Description of the Related Art

Modulation and demodulation of alternating carriers are commonly employed in the transmission of digital data via telephone lines. Known modulation and demodulation techniques involve the varying of the amplitude, frequency or phase of an alternating carrier according to the information to be transmitted. Examples of conventional modulation and demodulation techniques include amplitude shift keying (ASK), frequency shift keying (FSK) and phase shift keying (PSK). Some of the drawbacks of the conventional modulation and demodulation techniques are as follows:

1. The carrier frequency must be the same at the transmitting and receiving sides in order to ensure that the transmitted data can be recovered at the receiving side.

2. The stability of the carrier frequency is affected by several factors, including temperature, humidity and atmospheric pressure. As such, data loss usually occurs at the receiving side.

SUMMARY OF THE INVENTION

Therefore, the object of the present invention is to provide a novel method and apparatus for modulating and demodulating capable of overcoming the aforementioned drawbacks that are commonly associated with the prior art.

Specifically, the main object of the present invention is to provide a method and apparatus for modulating and demodulating which permit recovery of the transmitted data regardless of the carrier frequency at the transmitting and receiving sides.

According to a first aspect of the present invention, a method of generating a composite signal comprises the steps of:

providing a carrier wave generator for generating a first carrier cycle;

providing a ramp voltage generator for generating a ramp voltage signal with a slope that corresponds to an n-bit digital data byte;

controlling the ramp voltage generator so as to generate the ramp voltage signal for a predetermined duration at the end of the first carrier cycle; and controlling the carrier wave generator so as to generate a second carrier cycle at the end of the ramp voltage signal.

According to a second aspect of the present invention, a modulating apparatus comprises:

a carrier wave generator for generating a first carrier cycle;

a ramp voltage generator for generating a ramp voltage signal with a slope that corresponds to an n-bit digital data byte; and control means connected to the carrier wave generator and the ramp voltage generator, the control means controlling the ramp voltage generator so as to generate the ramp voltage signal for a predetermined duration at the end of the first carrier cycle, the control means further controlling the carrier wave generator so as to generate a second carrier cycle at the end of the ramp voltage signal.

The control means comprises: a detector connected to the carrier wave generator for detecting the end of the first carrier cycle; and a trigger circuit connected to the detector, the ramp voltage generator and the carrier wave generator. The trigger circuit is activated by the detector so as to disable the carrier wave generator and enable the ramp voltage generator for the predetermined duration upon detection of the end of the first carrier cycle. The trigger circuit disables the ramp voltage generator and enables the carrier wave generator so as to generate the second carrier cycle at the end of the predetermined duration.

According to a third aspect of the present invention, there is provided a method of demodulating a composite signal having a modulated signal corresponding to an n-bit digital data byte inserted between consecutive first and second carrier cycles, the modulated signal being in the form of a ramp voltage signal and having a slope that corresponds to the n-bit digital data byte. The method comprises the steps of:

detecting the start of the modulated signal in the composite signal;

determining the slope of the modulated signal; and converting the slope of the modulated signal into the n-bit digital data byte.

According to a fourth aspect of the present invention, there is provided a demodulating apparatus for demodulating a composite signal having a modulated signal corresponding to an n-bit digital data byte inserted between consecutive first and second carrier cycles, the modulated signal being in the form of a ramp voltage signal and having a slope that corresponds to the n-bit digital data byte. The demodulating apparatus comprises:

a position detector for detecting start of the modulated signal in the composite signal;

computing means for determining slope of the modulated signal; and converting means for converting the slope of the modulated signal into the n-bit digital data byte.

BRIEF DESCRIPTION OF THE DRAWINGS

Other features and advantages of the present invention will become apparent in the following detailed description of the preferred embodiments with reference to the accompanying drawings, of which:

FIG. 3(b) is a timing diagram showing the output of a ramp voltage generator of the modulating apparatus of FIG. 2;

FIG. 3(c) is a timing diagram showing the output of a zero-voltage detector of the modulating apparatus of FIG. 2;

FIG. 3(d) is a timing diagram showing the output of a trigger circuit of the modulating apparatus of FIG. 2;

FIGS. 9(a) and 9(b,) illustrate how first and second sine wave signals are stored in a sine wave memory of the carrier wave generator shown in FIG. 8;

FIG. 10(b) is a timing diagram showing the output of a ramp voltage generator of the modulating apparatus of FIG. 7;

FIG. 10(c) is a timing diagram showing the output of a zero-voltage detector of the modulating apparatus of FIG. 7;

FIG. 10(d) is a timing diagram showing the output of a trigger circuit of the modulating apparatus of FIG. 7.

DETAILED DESCRIPTION OF THE PREFERRED EMBODIMENTS

Before the present invention is described in greater detail, it should be noted that like elements are denoted by the same reference numerals throughout the disclosure.

In the first preferred embodiment of a modulating method and apparatus in accordance with the present invention, a modulated signal is inserted between two consecutive carrier cycles of an alternating carrier and is in the form of a ramp voltage of fixed duration and having a slope that corresponds to the digital data byte to be transmitted.

Figure 1:
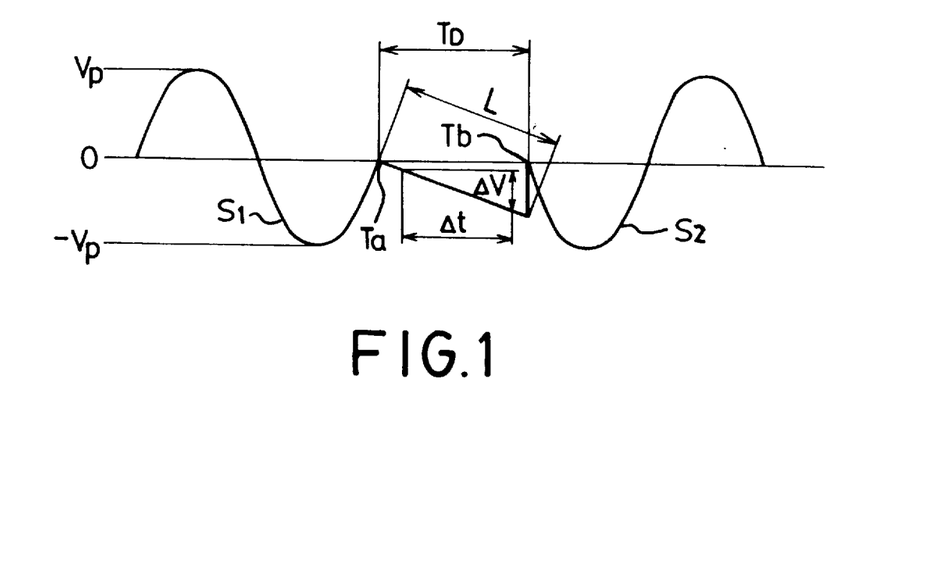
FIG. 1 illustrates an a composite signal that is generated in accordance with the first preferred embodiment of a modulating method and apparatus according to the present invention.

FIG. 1 illustrates a composite signal that is generated in accordance with the first preferred embodiment of a modulating method and apparatus of the present invention. As shown, a modulated signal is inserted between two consecutive carrier cycles S1, S2 of an alternating carrier and is in the form of a ramp voltage having a slope that corresponds to the digital data byte to be transmitted. The ramp voltage is defined by a line L that interconnects the terminating end Ta of the first carrier cycle S1 and the starting end Tb of the second carrier cycle S2. The slope m of the line L is determined as the rate of voltage change $\Delta v$ per unit time $\Delta t$.

Since the transmitted data is represented by the slope m of the line L, the duration TD of the ramp voltage is not critical as long as it falls within an acceptable range of the transmission medium, such as the telephone network.

In the present invention, the duration TD of the ramp voltage remains fixed, and the slope values range between ±M. As such, for n-bit data bytes, there are $2M/_2n$ different slopes that are available for use.

Table I illustrates the different slope values that are used to represent the different 4-bit data bytes according to the modulating method and apparatus of this invention when the alternating carrier has a carrier frequency of 2.5 KHz, a carrier period of 400 µs, and a peak-to-peak voltage of 2Vp. Note that the slope values vary in increments of (Vp/8)/400 µs.

TABLE I

| Data Byte | Slope |
| --- | --- |
| 0000 | Vp/400 µs |
| 0001 | (7Vp/8)/400 µs |
| 0010 | (6Vp/8)/400 µs |
| 0011 | (5Vp/8)/400 µs |
| 0100 | (4Vp/8)/400 µs |
| 0101 | (3Vp/8)/400 µs |
| 0110 | (2Vp/8)/400 µs |
| 0111 | (Vp/8)/400 µs |
| 1000 | (−Vp/8)/400 µs |
| 1001 | (−2Vp/8)/400 µs |
| 1010 | (−3Vp/8)/400 µs |
| 1011 | (−4Vp/8)/400 µs |
| 1100 | (−5Vp/8)/400 µs |
| 1101 | (−6Vp/8)/400 µs |
| 1110 | (−7Vp/8)/400 µs |
| 1111 | −Vp/400 µs |

The carrier frequency should not be limited to that which can be accepted by a telephone network. The carrier frequency may be increased to the radio frequency range, such as 30 MHz. Accordingly, the duration TD of the ramp voltage should be adjusted so that it falls within an acceptable range for radio transmission, such as 40 ns.

Figure 2:
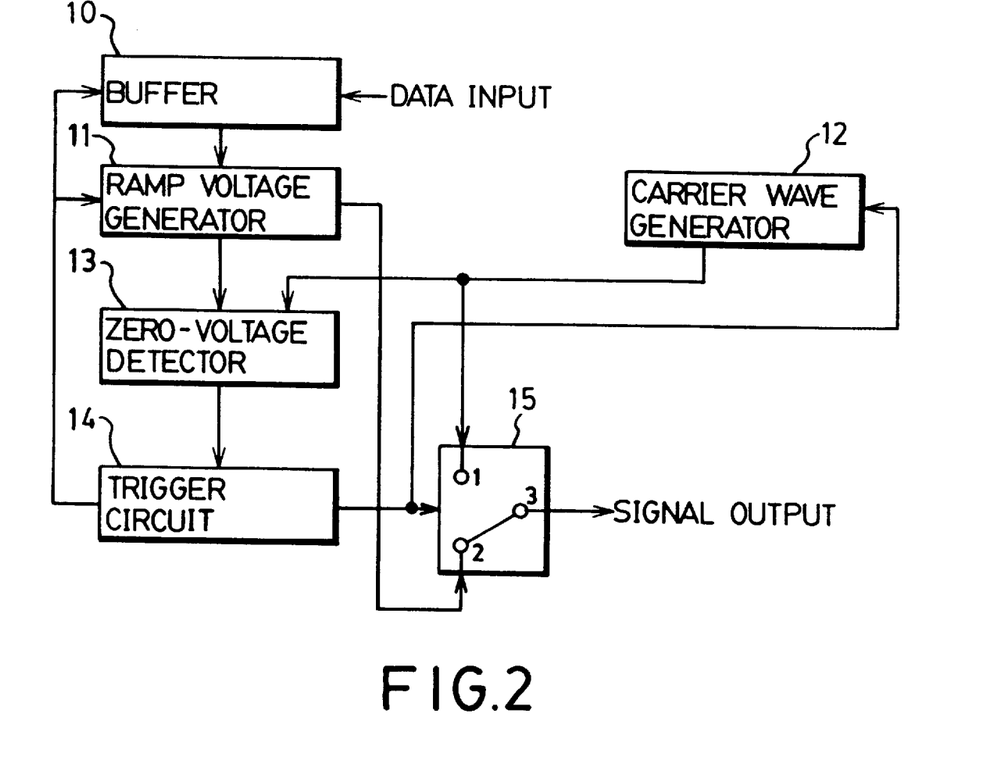
FIG. 2 is a schematic circuit block diagram of the modulating apparatus according to the first preferred embodiment of the present invention.

As shown in FIG. 2, the first preferred embodiment of a modulating apparatus 1 according to the present invention is shown to comprise a buffer 10, a ramp voltage generator 11, a carrier wave generator 12, a zero-voltage detector 13, a trigger circuit 14 and a switch unit 15.

The buffer 10 receives the digital data to be transmitted and groups the same into n-bit data bytes.

The ramp voltage generator 11 is connected electrically to the buffer 10 and generates a ramp voltage output, such as the ramp voltage shown in FIG. 1, corresponding to the data byte received from the buffer 10. In this embodiment, the ramp voltage generator 11 is implemented as a capacitor charged by a current source. As such, the capacitor voltage vc is equal to the charging current I multiplied by the charging time t and divided by the capacitance c of the capacitor.

The carrier wave generator 12 is a sine wave generator which generates an alternating sine wave signal when activated.

The zero-voltage detector 13 is connected electrically to the carrier wave generator 12 and the ramp voltage generator 11, and generates a trigger signal each time the carrier wave generator 12 produces one carrier cycle.

The trigger circuit 14 is connected electrically to the buffer 10, the ramp voltage generator 11, the carrier wave generator 12 and the zero-voltage detector 13. The trigger circuit 14 generates a control pulse having a duration TD upon receipt of the trigger signal from the zero-crossing detector 13. The control pulse is used to disable the carrier wave generator 12 and to enable the ramp voltage generator 11 so as to generate the ramp voltage output after a carrier cycle from the carrier wave generator 12.

The switch unit 15 has a first switch input connected electrically to the carrier wave generator 12, a second switch input connected electrically to the ramp voltage generator 11, and a control input connected electrically to the trigger circuit 14. The switch unit 15 normally connects the carrier wave generator 12 to an output switch contact thereof. However, upon reception of the control pulse from the trigger circuit 14, the switch unit 15 connects the ramp voltage generator 11 to the output switch contact.

The operation of the modulating apparatus 1 is as follows:

Step 1. Initially, the buffer 10 groups the digital data to be transmitted into n-bit data bytes, and provides a first one of the data bytes to the ramp voltage generator 11.

Step 2. The carrier wave generator 12 generates one carrier cycle output which is detected at the output switch contact of the switch unit 15, as shown by the period before t1 in FIG. 3(a).

Step 3. The zero-voltage detector 13 generates the trigger signal upon detecting that the carrier wave generator 12 has produced one carrier cycle output, i.e. two zero-crossings after activation of the detector 13, as shown by the high-to-low level transition during t1 in FIG. 3(c).

Figure 3A:
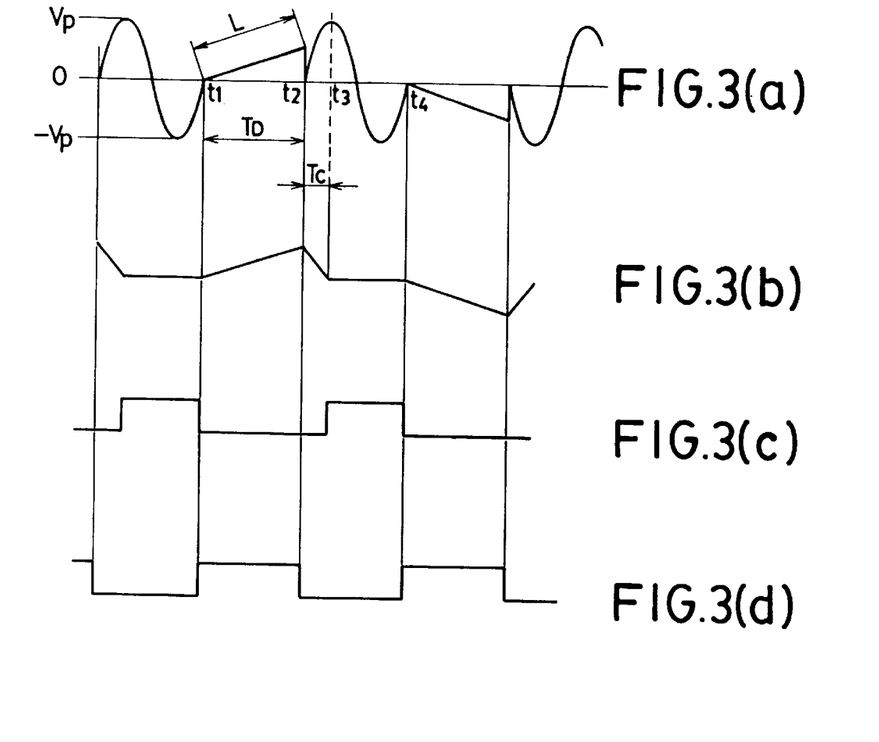
FIG. 3(a) is a timing diagram showing the composite output of the modulating apparatus of the first preferred embodiment.

Step 4. The trigger circuit 14 generates the control pulse with a duration TD upon reception of the trigger signal from the zero-voltage detector 13, as shown in FIG. 3(d). The control pulse is used to disable the carrier wave generator 12, to enable the ramp voltage generator 11 to generate the ramp voltage output corresponding to the data byte from the buffer 10, as shown in FIG. 3(b), and to control the switch unit 15 so that the ramp voltage output of the ramp voltage generator 11 can be detected at the output switch contact of the switch unit 15, as shown by the period between t1 and t2 in FIG. 3(a).

Step 5. At the end of the control pulse, the buffer 10 is enabled by the trigger circuit 14 so as to provide a second one of the data bytes to the ramp voltage generator 11. At the same time, the ramp voltage generator 11 is disabled so as to discharge the same, the carrier wave generator 12 is enabled, and the switch unit 15 connects the carrier wave generator 12 to the output switch contact thereof.

Step 6. After a discharge time Tc, the ramp voltage generator 11 activates the zero-crossing detector 13 to initiate detection of another carrier cycle output of the carrier wave generator 12.

Step 7. Steps 3 to 6 are again repeated to obtain the waveform shown in FIG. 3(a).

It should be noted that the dedicated circuitry of the first preferred embodiment may be easily implemented in the form of a microprocessor. The operation of the microprocessor is generally similar to that mentioned beforehand. That is, after one carrier cycle has been generated, a ramp voltage corresponding to the data byte to be transmitted is generated before another carrier cycle is produced.

Figure 4:
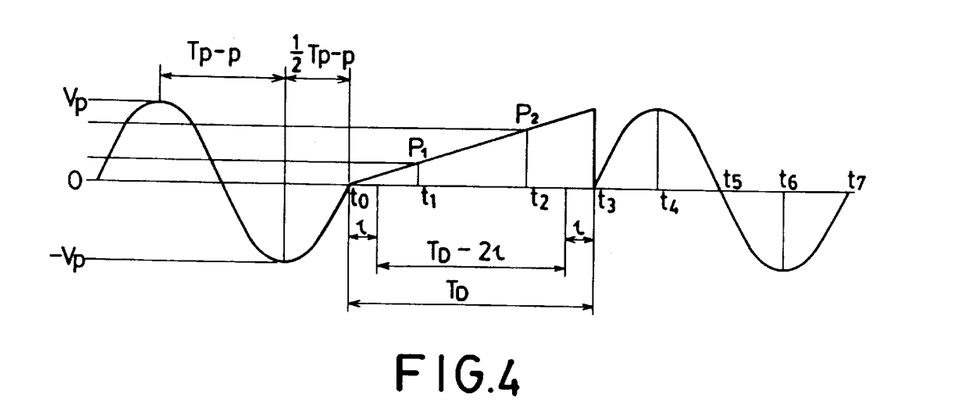
FIG. 4 illustrates how the composite signal of FIG. 1 is demodulated in accordance with the preferred embodiment of a demodulating method and apparatus according to the present invention.

Referring to FIG. 4, recovery of the digital data from the composite signal that is generated by the modulating apparatus 1 of FIG. 2 is performed in accordance with the demodulating method and apparatus of the present invention by sampling the modulated signal during the duration TD between adjacent carrier cycles of the composite signal at several points P1, P2, calculating the slope of a line which connects the sampled points P1, P2, and converting the slope into the transmitted digital data. Detecting the location of the modulated signal can be accomplished in many ways. In this embodiment, the location is determined after detecting the following in sequence: a first wave cycle peak, a zero crossing, and a second wave cycle peak. If the time period between the first and second wave cycle peaks is Tp-p, the location of the modulated signal can be found at a time period ½Tp-p after the second wave cycle peak.

Figure 5:
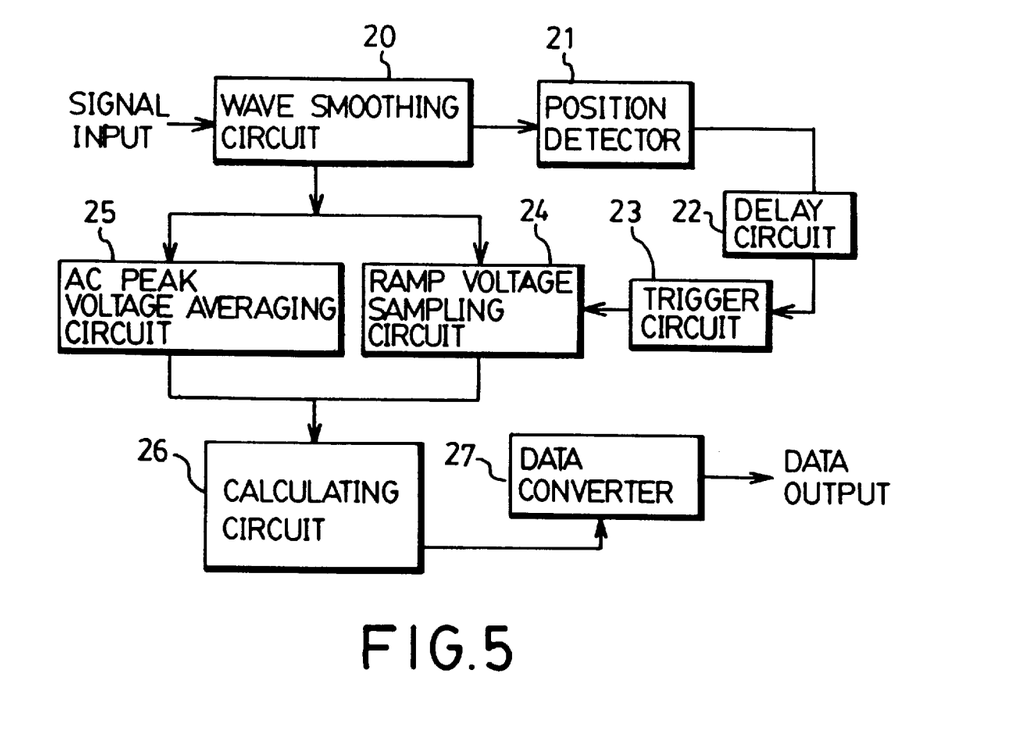
FIG. 5 is a schematic circuit block diagram of the demodulating apparatus according to the present invention.

Referring to FIG. 5, the preferred embodiment of a demodulating apparatus 2 according to the present invention is shown to comprise a wave smoothing circuit 20, a position detector 21, a delay circuit 22, a trigger circuit 23, a ramp voltage sampling circuit 21, an AC peak voltage averaging circuit 22, a calculating circuit 26 and a data converter 27.

The wave smoothing circuit 20 is responsible for removing noise signals from the composite signal.

The position detector 21 is connected electrically to the wave smoothing circuit 20 and is used to detect the start of a modulated signal in the composite signal. As mentioned beforehand, the start of the modulated signal is determined by detecting the following in sequence: a first wave cycle peak, a zero crossing, and a second wave cycle peak. The time period Tp-p between the first and second wave cycle peaks is detected, and the start of the modulated signal is determined to be at a time period ½Tp-p after the second wave cycle peak.

The position detector 21 is used to actuate the trigger circuit 23. However, the delay circuit 22 connects electrically the position detector 21 and the trigger circuit 23 so as to delay actuation of the trigger circuit 23 by a time period τ after the start t0 of the modulated signal in order to minimize the effect of noise at time t0 due to the transition from the carrier cycle signal to the ramp voltage signal, as shown in FIG. 4.

When actuated, the trigger circuit 23 generates a control pulse with a duration TD−2τ. As such, the effect of noise at times t0, t3 due to the transition from the carrier cycle signal to the ramp voltage signal and vice versa can be minimized, as shown in FIG. 4.

The ramp voltage sampling circuit 24 is connected electrically to the wave smoothing circuit 20 and the trigger circuit 23. The sampling circuit 24 is activated by the control pulse from the trigger circuit 23 so as to detect the voltages of at least two sampled points P1, P2 at different times t1, t2 within the duration TD of the modulated signal.

The AC peak voltage averaging circuit 25 is connected electrically to the wave smoothing circuit 20 and calculates an average peak voltage Vp' according to the following equation:

$$Vp' = \left[ \sum_{i=1}^{n} |Vi| \right] \times \frac{1}{n}$$

The average peak voltage Vp' is obtained by sampling the composite signal continuously for a period of time, such as 10 seconds or 1 minute. As such, the effect of different factors, like the transmission medium, which can affect the value of the peak voltage can be minimized.

It should be noted that, in the present invention, the slope m' of the modulated signal at the receiving side may be different from the slope m of the modulated signal at the transmitting side due to signal attenuation as the composite signal is conveyed through the transmission medium, such as the telephone network. However, the ratio of the slope m or m' to the peak voltage Vp or Vp' of the carrier cycle remains substantially the same at both the transmitting and receiving sides. Thus, the digital data encoded in the modulated signal can be recovered at the receiver side only after the ratio of the slope m' to the average peak voltage Vp' has been calculated.

The calculating circuit 26 is connected electrically to the ramp voltage sampling circuit 24 and the peak voltage averaging circuit 25. The calculating circuit 26 calculates the ratio of the slope m' of the modulated signal to the average peak voltage Vp' in accordance with the following equation:

$$\text{Ratio} = \left[ \sum_{j=1}^{n} \frac{(V_j - V_{j-1})}{(t_j - t_{j-1})} \times \frac{1}{Vp'} \right] \times \frac{1}{n}$$

In the present embodiment, the calculating circuit 26 is implemented in the form of a microprocessor.

The data converter 27 is connected electrically to the calculating circuit 26 and converts the computed ratio from the calculating circuit 26 into the original transmitted digital data.

It should be noted that, since the slope m' may be an average value, the effect of noise on the recovery of the transmitted digital data at the receiving side can be minimized. In addition, the composite signal of FIG. 4 can be demodulated, once the position of the modulated signal has been determined by detecting in sequence a first wave cycle peak, a zero crossing and a second wave cycle peak, even if the carrier frequency at the transmitting and receiving sides are different. As such, the user of the present invention can receive digital data from a first party which transmits a composite signal at a first carrier frequency, such as 3.6 KHz, and from a second party which transmits a composite signal at a second carrier frequency, such as 1.2 KHz, without the need for adjusting any component thereof.

Referring again to FIG. 1, it is noted that an abrupt voltage change during the transition from the ramp voltage signal to the carrier cycle S2 can lead to high frequency loss and signal distortion at the transition point Tb when the composite signal is conveyed to the receiving side via the transmission medium, such as the telephone network. However, the effect of high frequency loss and signal distortion does not impair recovery of the digital data since sampling at the transition point Tb is avoided in the demodulating method and apparatus of this invention.

Figure 6:
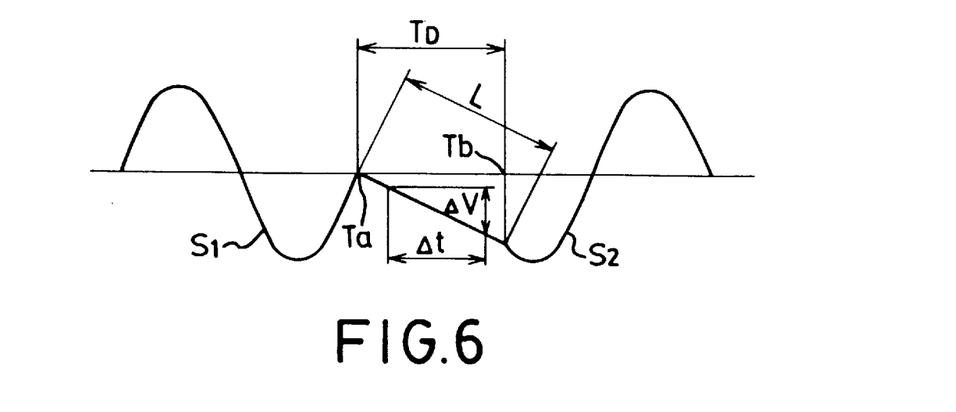
FIG. 6 illustrates a composite signal that is generated in accordance with the second preferred embodiment of a modulating method and apparatus according to the present invention.

FIG. 6 illustrates a composite signal that is generated in accordance with the second preferred embodiment of a modulating method and apparatus according to the present invention. The composite signal of FIG. 6 is generally similar to that shown in FIG. 1, except that the starting end Tb of the second carrier cycle S2 continues from the peak voltage level of the ramp voltage signal, thereby avoiding the presence of an abrupt voltage change during the transition from the ramp voltage signal to the carrier cycle S2.

Figure 7:
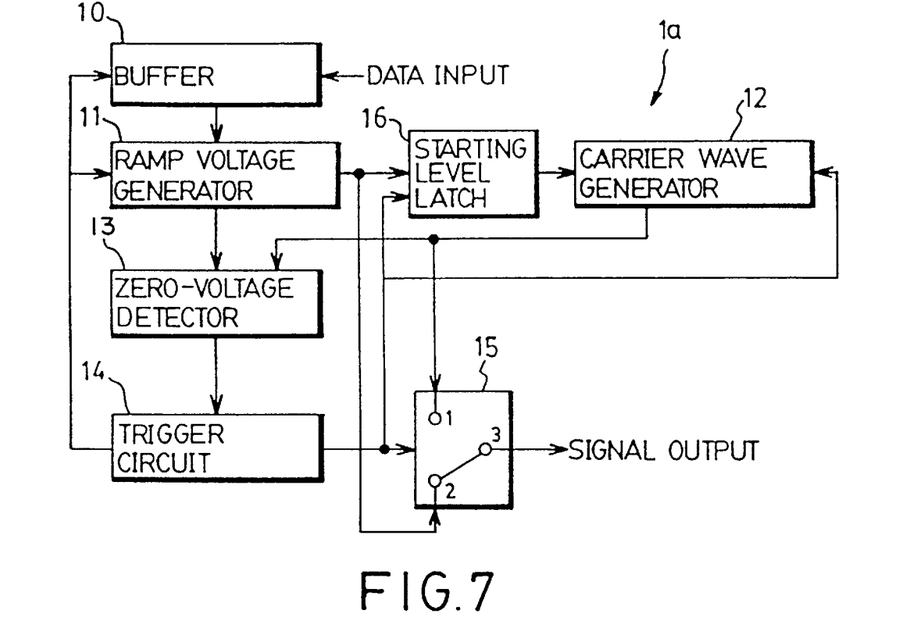
FIG. 7 is a schematic circuit block diagram of the modulating apparatus according to the second preferred embodiment of the present invention.

FIG. 7 illustrates the second preferred embodiment of a modulating apparatus 1a according to the present invention. The modulating apparatus 1a is generally similar to the modulating apparatus 1 shown in FIG. 2, except for the inclusion of a starting level latch 16 which connects electrically the ramp voltage generator 11 and the carrier wave generator 12.

The starting level latch 16 is controlled by the trigger circuit 14 so as to latch the voltage output of the ramp voltage generator 11 at the end of the duration TD. As such, the carrier wave generator 12 generates a carrier cycle which has a starting voltage level equal to the voltage latched by the starting level latch 16 when the carrier wave generator 12 is activated by the trigger circuit 14.

Figure 8:
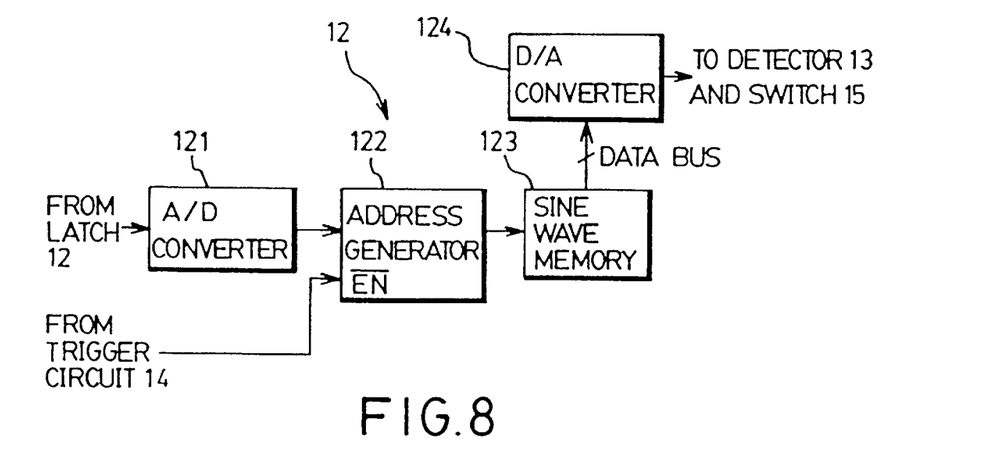
FIG. 8 is a schematic circuit block diagram of a carrier wave generator for the modulating apparatus of the second preferred embodiment.

FIG. 8 illustrates a preferred implementation of the carrier wave generator 12 for the modulating apparatus 1a of this embodiment. As shown, the carrier wave generator 12 comprises an analog-to-digital (A/D) converter 121, an address generator 122, a sine wave memory 123 and a digital-to-analog converter 124.

The A/D converter 121 is connected electrically to the starting level latch 16 and converts the voltage latched thereby into starting address data Ma or Na.

Figure 9A:
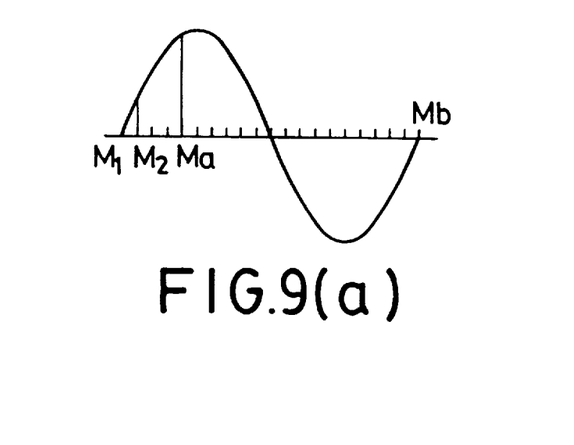
Figure 9B:
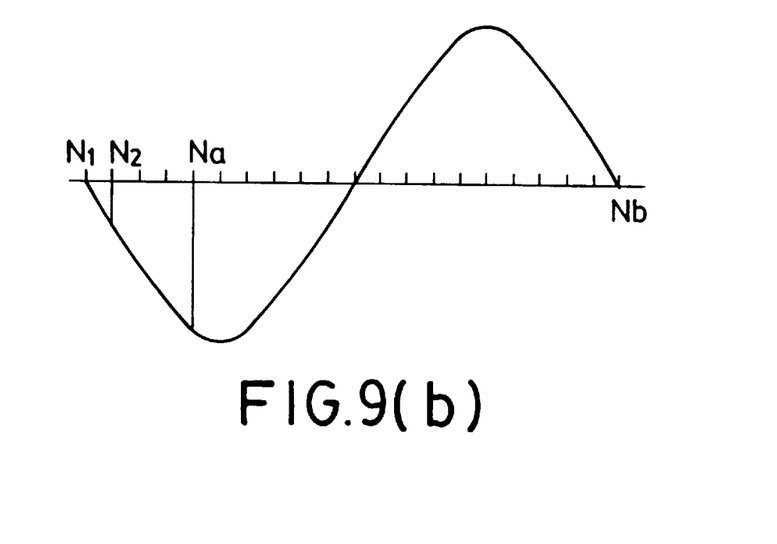
Figure 10A:
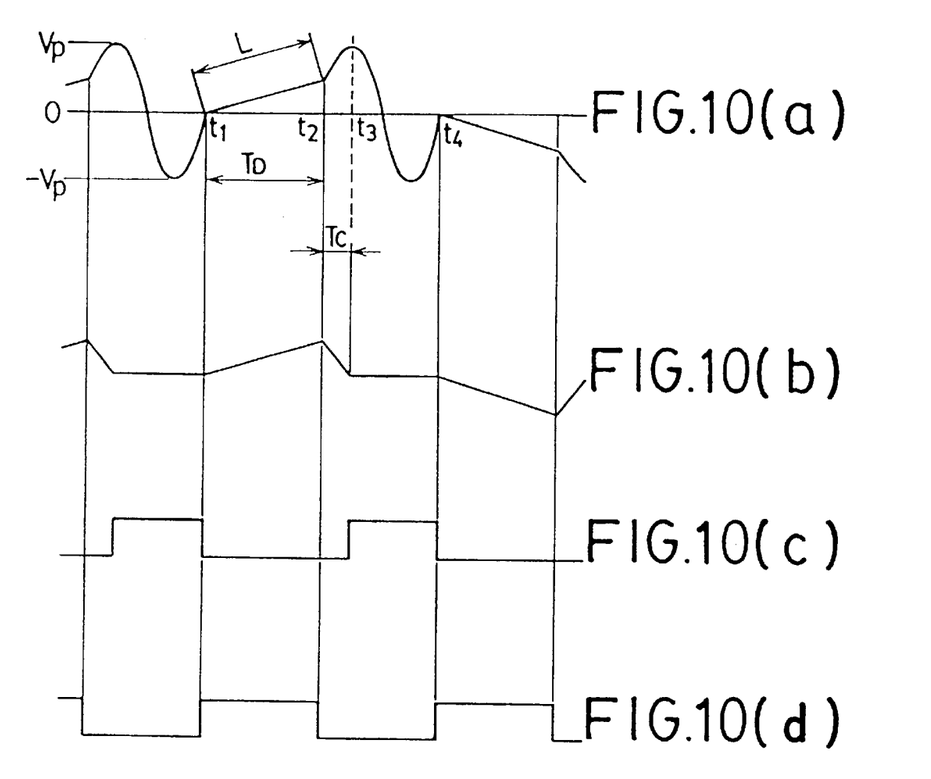
FIG. 10(a) is a timing diagram showing the composite signal output of the modulating apparatus of the second preferred embodiment.

The sine wave memory 123 has consecutive addressable memory spaces M2 to Mb and N1 to Nb that contain digitized samples of first and second sine wave signals therein. Referring to FIGS. 9(a) and 9(b), the second sine wave signal SW2 is shown to be 180° out-of-phase with respect to the first sine wave signal SW1.

The address generator 122 is connected electrically to the A/D converter 121 and to address inputs of the sine wave memory 123. The address generator 122 is implemented as a sequential counter and is enabled by the control pulse from the trigger circuit 14 so as to generate sequential address signals, starting from the address data Ma or Na of the A/D converter 121, for controlling the output of the digitized samples from the sine wave memory 123.

The D/A converter 124 is connected electrically to the sine wave memory 123 so as to receive the digitized samples therefrom. The D/A converter 124 converts the digitized samples into a carrier cycle signal which is supplied to the zero-voltage detector 13 and the switch unit 15.

The relationships among the output of the modulating apparatus 1a and the outputs of the ramp voltage generator 11, the zero-voltage detector 13 and the trigger circuit 14 in this embodiment are shown in FIGS. 10(a) to 10(d). Since the operation of the modulating apparatus 1a of the second preferred embodiment is generally similar to that of the modulating apparatus 1 of the first preferred embodiment, a detailed description of the same will not be incorporated herein.

Referring to FIG. 10(b), note that erroneous operation of the zero-voltage detector 14 may occur if the discharge time Tc is too short, such as when the data bytes 0111 and 1000 are being transmitted in accordance with Table I. If the discharge time Tc is too long, such as in excess of one-fourth of the period of one carrier cycle, erroneous operation of the zero-voltage detector 14 can also occur since the latter may be deactivated when the 180° zero crossing of the carrier cycle occurs. As such, it is desirable to choose the range of charging current I for the capacitor of the ramp voltage generator 11 to ensure that the discharge time Tc is always between zero and one-fourth of the period of one carrier cycle.

Figure 11:
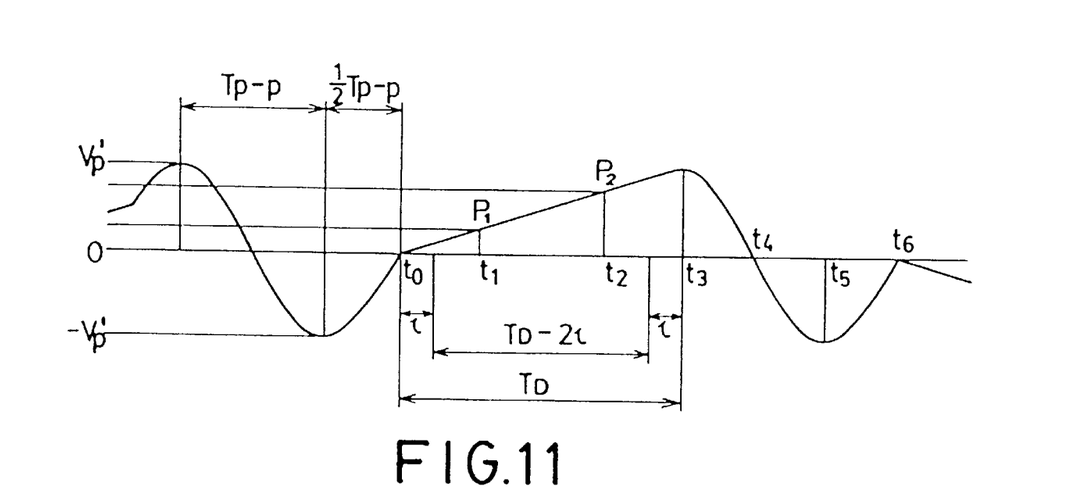
FIG. 11 illustrates how the composite signal of FIG. 6 is demodulated in accordance with the demodulating method and apparatus of the present invention.

Referring to FIG. 11, recovery of the digital data from the composite signal of the modulating apparatus 1a is also performed in accordance with the demodulating method and apparatus of the present invention by sampling the modulated signal during the duration TD between consecutive carrier cycles of the alternating carrier at several points P1, P2, calculating the slope of a line which connects the sampled points P1, P2, and converting the result into the transmitted digital data. The start of the modulated signal is determined after detecting the following in sequence: a first wave cycle peak, a zero crossing, and a second wave cycle peak. If the time period between the first and second wave cycle peaks is Tp-p, the start of the modulated signal can be found at a time period ½Tp-p after the second wave cycle peak. Therefore, the demodulating apparatus 2 shown in FIG. 5 can still be used to recover the transmitted digital data from the waveform of FIG. 11.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A method of generating a composite signal, comprising the steps of:

generating a carrier having consecutive carrier cycles; and inserting a modulated signal corresponding to an n-bit digital data byte between the consecutive carrier cycles to generate the composite signal.

2. The method of claim 1, wherein the modulated signal is in the form of a ramp voltage of fixed duration and having a slope that corresponds to the n-bit digital data byte.

3. A method of generating a composite signal, comprising the steps of:

providing a carrier wave generator for generating a first carrier cycle;

providing a ramp voltage generator for generating a ramp voltage signal with a slope that corresponds to an n-bit digital data byte;

controlling the ramp voltage generator so as to generate the ramp voltage signal for a predetermined duration at the end of the first carrier cycle; and controlling the carrier wave generator so as to generate a second carrier cycle at the end of the ramp voltage signal.

4. The method of claim 3, wherein the carrier wave generator is an alternating carrier wave generator, and the second carrier cycle continues from a peak voltage level of the ramp voltage signal.

5. A modulating apparatus, comprising:

a carrier wave generator for generating a first carrier cycle;

a ramp voltage generator for generating a ramp voltage signal with a slope that corresponds to an n-bit digital data byte; and control means connected to said carrier wave generator and said ramp voltage generator, said control means controlling said ramp voltage generator so as to generate the ramp voltage signal for a predetermined duration at the end of the first carrier cycle, said control means further controlling said carrier wave generator so as to generate a second carrier cycle at the end of the ramp voltage signal.

6. The modulating apparatus as claimed in claim 5, wherein said control means comprises:

a detector connected to said carrier wave generator for detecting the end of the first carrier cycle; and a trigger circuit connected to said detector, said ramp voltage generator and said carrier wave generator, said trigger circuit being activated by said detector so as to disable said carrier wave generator and enable said ramp voltage generator for the predetermined duration upon detection of the end of the first carrier cycle, said trigger circuit disabling said ramp voltage generator and enabling said carrier wave generator so as to generate the second carrier cycle at the end of the predetermined duration.

7. The modulating apparatus as claimed in claim 6, further comprising a switch unit having switch inputs connected to said ramp voltage generator and said carrier wave generator, a control input connected to said trigger circuit, and an output switch contact, said trigger circuit controlling said switch unit so as to connect said ramp voltage generator to said output switch contact only during the predetermined duration.

8. The modulating apparatus as claimed in claim 6, further comprising a starting level latch which is connected to said trigger circuit and which interconnects said ramp voltage generator and said carrier wave generator, said starting level latch being controlled by said trigger circuit so as to latch a peak voltage of the ramp voltage signal at the end of the predetermined duration, the carrier wave generator being an alternating carrier wave generator, and the second carrier cycle continuing from the peak voltage of the ramp voltage signal.

9. A method of demodulating a composite signal having a modulated signal corresponding to an n-bit digital data byte inserted between consecutive first and second carrier cycles, the modulated signal being in the form of a ramp voltage signal and having a slope that corresponds to the n-bit digital data byte, said method comprising the steps of:

detecting the start of the modulated signal in the composite signal;

determining the slope of the modulated signal; and converting the slope of the modulated signal into the n-bit digital data byte.

10. The method as claimed in claim 9, wherein the first and second carrier cycles are alternating carrier cycles, the detecting step comprising the sub-steps of:

detecting, in sequence, a first cycle peak, a zero crossing and a second cycle peak of the first carrier cycle; and determining the time period between the first and second cycle peaks, the start of the modulated signal occurring one-half of the time period between the first and second cycle peaks after the second cycle peak.

11. The method as claimed in claim 9, wherein the determining step comprises the sub-steps of:

sampling at least two points of the modulated signal at different times; and computing the rate of voltage change per unit time for the sampled points to obtain the slope.

12. The method as claimed in claim 11, wherein the converting step comprises the sub-steps of:

determining peak voltage of the composite signal;

dividing the computed slope by the peak voltage to obtain a ratio; and converting the ratio into the n-bit digital data byte.

13. A demodulating apparatus for demodulating a composite signal having a modulated signal corresponding to an n-bit digital data byte inserted between consecutive first and second carrier cycles, the modulated signal being in the form of a ramp voltage signal and having a slope that corresponds to the n-bit digital data byte, said demodulating apparatus comprising:

a position detector for detecting start of the modulated signal in the composite signal;

computing means for determining slope of the modulated signal; and converting means for converting the slope of the modulated signal into the n-bit digital data byte.

14. The demodulating apparatus as claimed in claim 13, wherein the first and second carrier cycles are alternating carrier cycles, said position detector detecting a first cycle peak, a zero crossing and a second cycle peak of the first carrier cycle in sequence, said position detector further determining time period between the first and second cycle peaks, the start of the modulated signal occurring one-half of the time period between the first and second cycle peaks after the second cycle peak.

15. The demodulating apparatus as claimed in claim 13, wherein said computing means comprises:

a sampling circuit for sampling at least two points of the modulated signal at different times; and a calculating circuit for computing rate of voltage change per unit time for the sampled points to obtain the slope.

16. The demodulating apparatus as claimed in claim 15, wherein said converting means comprises means for determining peak voltage of the composite signal, said calculating circuit dividing the slope by the peak voltage to obtain a ratio, said converting means further comprising a data converter for converting the ratio into the n-bit digital data byte.

\* \* \* \* \*